(12) United States Patent
Park et al.

(10) Patent No.: US 11,848,308 B2
(45) Date of Patent: Dec. 19, 2023

(54) SEMICONDUCTOR PACKAGE

(71) Applicant: Samsung Electronics Co., Ltd., Suwon-si (KR)

(72) Inventors: Wansoo Park, Seoul (KR); Sang Sub Song, Suwon-si (KR); Kyung Suk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 17/325,907

(22) Filed: May 20, 2021

(65) Prior Publication Data

US 2022/0139879 A1    May 5, 2022

(30) Foreign Application Priority Data

Oct. 29, 2020 (KR) .......................... 10-2020-0142200

(51) Int. Cl.
*H01L 25/065* (2023.01)
(52) U.S. Cl.
CPC .. *H01L 25/0657* (2013.01); *H01L 2225/0651* (2013.01); *H01L 2225/06506* (2013.01); *H01L 2225/06562* (2013.01)
(58) Field of Classification Search
CPC ........................................... H01L 2225/06562
See application file for complete search history.

(56) References Cited

U.S. PATENT DOCUMENTS

| 7,199,458 | B2 | 4/2007 | Lee |
| 7,423,339 | B2 | 9/2008 | Wark |
| 8,415,808 | B2 | 4/2013 | Liao et al. |
| 8,729,689 | B2 | 5/2014 | Hwang et al. |
| 10,580,756 | B2 | 3/2020 | Lo |
| 2005/0067694 | A1 | 3/2005 | Pon et al. |
| 2021/0351152 | A1* | 11/2021 | Zhang ..................... H01L 25/50 |

* cited by examiner

*Primary Examiner* — Yu-Hsi D Sun
(74) *Attorney, Agent, or Firm* — Muir Patent Law, PLLC

(57) ABSTRACT

Disclosed is a semiconductor package comprising a substrate, a chip stack including semiconductor chips stacked in an ascending stepwise shape on the substrate, first power/ground wires through which the substrate is connected to a lowermost semiconductor chip of the chip stack and neighboring semiconductor chips of the chip stack are connected to each other, and a second power/ground wire that extends from a first semiconductor chip and is connected to the substrate. The first semiconductor chip is one semiconductor chip other than the lowermost semiconductor chip and an uppermost semiconductor chip of the chip stack. The chip stack includes a first stack and a second stack on the first stack. The second stack constitutes a channel separate from that of the first stack.

20 Claims, 12 Drawing Sheets

SEMICONDUCTOR PACKAGE

CROSS-REFERENCE TO RELATED APPLICATION

This U.S. non-provisional application claims priority under 35 U.S.C § 119 to Korean Patent Application No. 10-2020-0142200, filed on Oct. 29, 2020, in the Korean Intellectual Property Office, the entire content of which is hereby incorporated by reference.

BACKGROUND

The present inventive concepts relate to a semiconductor package, and more particularly to, a semiconductor package including a stacked integrated circuit.

A typical stacked package has a structure in which pluralities of substrates are stacked. For example, the stacked package may include semiconductor chips that are sequentially stacked on a printed circuit board (PCB). Connection pads are formed on the semiconductor chips. Bonding wires may be used to connect the connection pads, such that the semiconductor chips may be electrically coupled to each other. The printed circuit board is provided thereon with a logic chip that controls the semiconductor chips.

Portable devices have been increasingly demanded in recent electronic product markets, and as a result, it has been ceaselessly required for reduction in size and weight of electronic parts mounted on the portable devices. To accomplish the reduction in size and weight of the electronic parts, there is need for technology not only to reduce each size of mounting parts, but to integrate a number of individual devices on a single package. In particular, semiconductor packages operated at high frequency signals are required to have compactness and excellent electrical characteristics.

SUMMARY

Some embodiments of the present inventive concepts provide a semiconductor package with increased electrical characteristics.

According to some embodiments of the inventive concepts, a semiconductor package may comprise: a substrate including a plurality of first power/ground pads and second power/ground pads; a chip stack including a plurality of semiconductor chips that are stacked in a first direction in an ascending stepwise shape along a second direction on the substrate, each of the plurality of semiconductor chips including a plurality third power/ground pads; a plurality of first power/ground wires that connect the first power/ground pads of the substrate to the third power/ground pads of a lowermost semiconductor chip of the chip stack and connect the third power/ground pads of neighboring semiconductor chips of the chip stack to each other; and a second power/ground wire that extends from the third power/ground pad of a first semiconductor chip of the chip stack and is directly connected to a second power/ground pad of the substrate, and the first semiconductor chip being one semiconductor chip other than the lowermost semiconductor chip and an uppermost semiconductor chip of the chip stack. The chip stack may include a first stack and a second stack on the first stack. The second stack may constitute a channel that is separate from a channel of the first stack.

According to some embodiments of the inventive concepts, a semiconductor package may comprise: a substrate including a plurality of first power/ground pads, a plurality of second power/ground pads, a plurality of first input/output pads, and a plurality of second input/output pads; a chip stack including a plurality of semiconductor chips that are stacked in a first direction and disposed in an offset stack structure along a second direction on the substrate, each of the plurality of semiconductor chips including a plurality third power/ground pads and a plurality of third input/output pads; a first power/ground wire that directly connects one of the first power/ground pads of the substrate to one of the third power/ground pads of a first semiconductor chip included in the plurality of semiconductor chips, other than a lowermost and an uppermost ones of the semiconductor chips of the chip stack; and a plurality of first input/output wires that each directly connects the first input/output pads of the substrate to the third input/output pads of a second semiconductor chip included in the plurality of semiconductor chips, other than the lowermost and uppermost ones of the semiconductor chips of the chip stack. When viewed in plan, the first power/ground wire may be positioned between the first input/output wires.

According to some embodiments of the inventive concepts, a semiconductor package may comprise: a substrate including a plurality of first power/ground pads, a plurality of second power/ground pads, a plurality of first input/output pads, and a plurality of second input/output pads; a first stack including a plurality of first semiconductor chips that are stacked in a first direction on the substrate; a second stack including a plurality of second semiconductor chips that are stacked in the first direction on the first stack, each of the plurality of first semiconductor chips and the plurality of second semiconductor chips include a plurality of third power/ground pads and a plurality of third input/output pads; a plurality of first input/output wires that connect the third input/output pads of neighboring first semiconductor chips; a plurality of second input/output wires that connect the third input/output pads of neighboring second semiconductor chips to each other; a plurality of first power/ground wires that connect the third power/ground pads of neighboring first semiconductor chips and neighboring second semiconductor chips; a third input/output wire that directly connects a third input/output pad of one of the second semiconductor chips to one of the plurality of second input/output pads of the substrate; a second power/ground wire that directly connects a third power/ground pad of the one of the second semiconductor chips to one of the plurality of second power/ground pads of the substrate; and a molding layer on the substrate, the molding layer covering the first stack and the second stack.

DETAILED DESCRIPTION OF EMBODIMENTS

The following will now describe a semiconductor package according to the inventive concepts with reference to the accompanying drawings.

Figure 1:
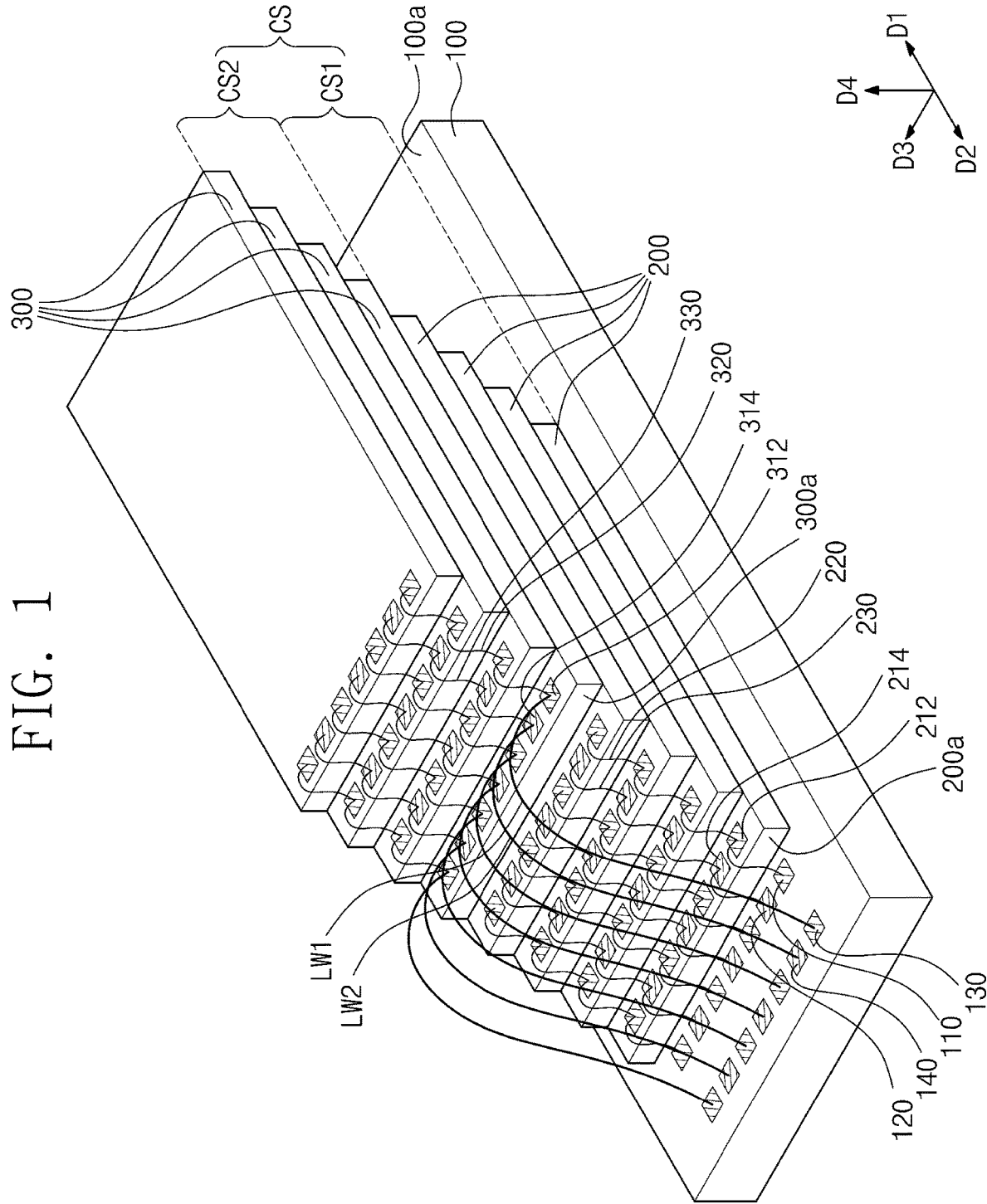
FIG. 1 is a perspective view illustrating a semiconductor package according to some embodiments of the inventive concepts.
Figure 2:
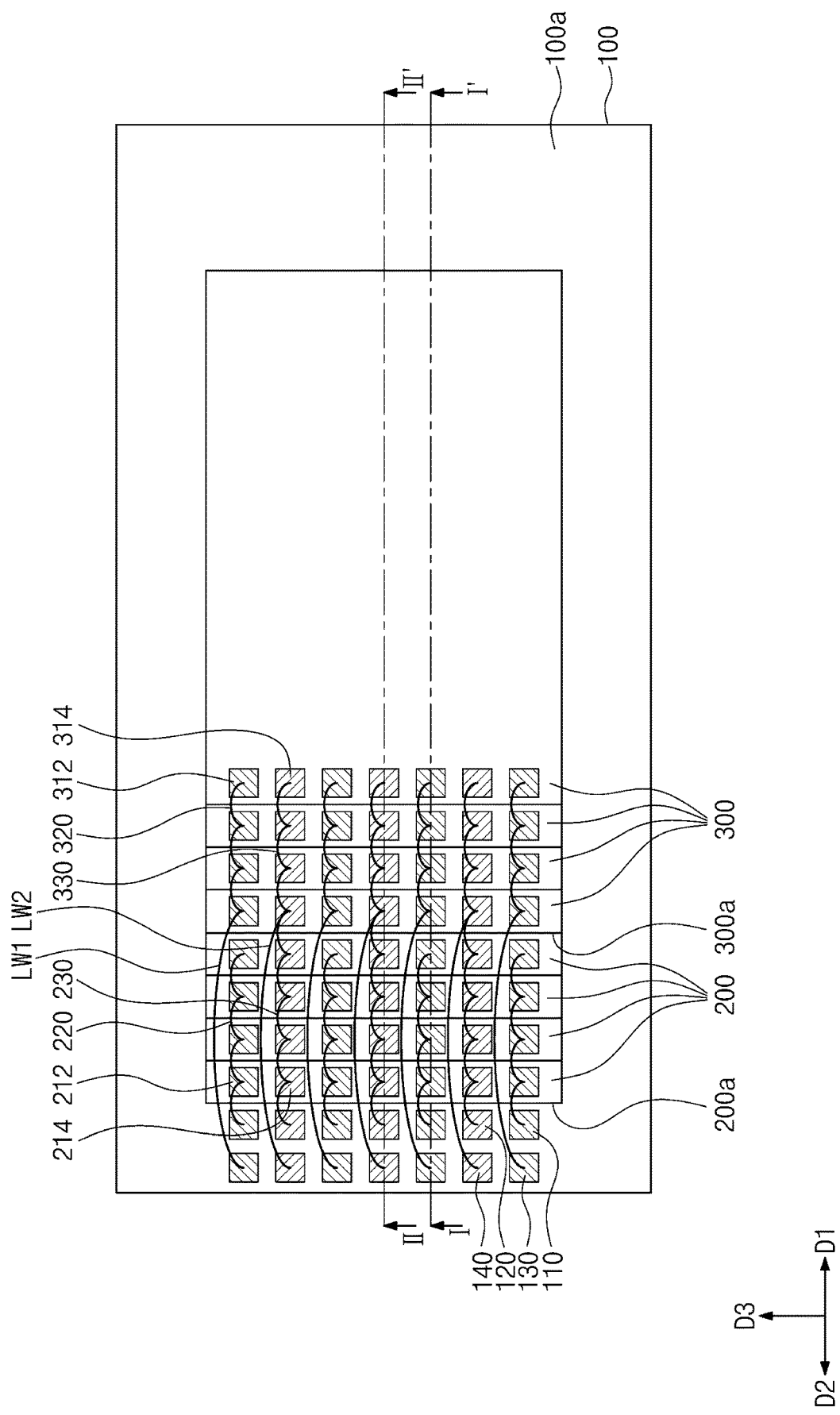
FIG. 2 is a plan view illustrating a semiconductor package according to some embodiments of the inventive concepts.
Figure 3:
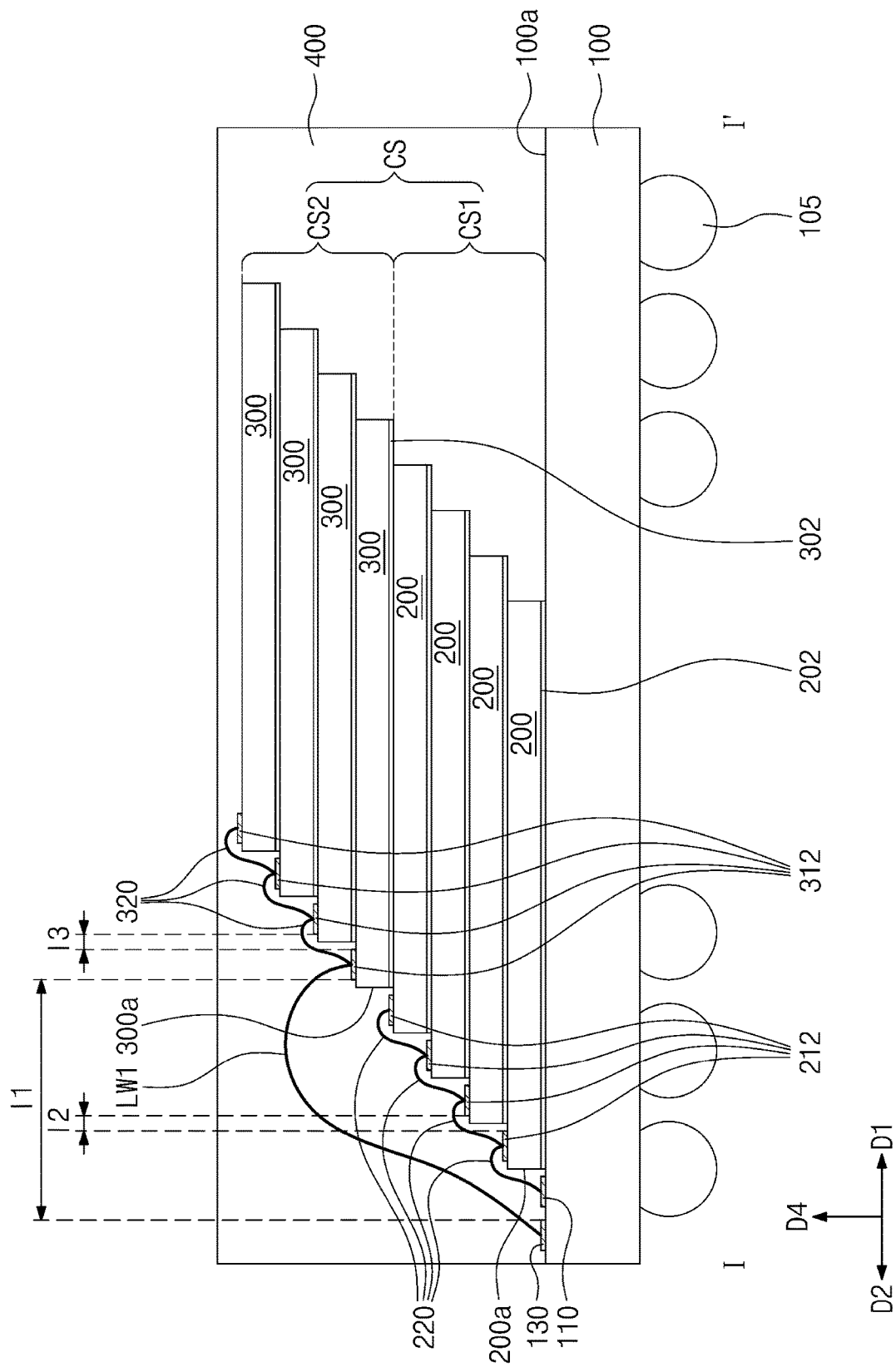
FIGS. 3 and 4 are cross-sectional views illustrating a semiconductor package according to some embodiments of the inventive concepts.
Figure 4:
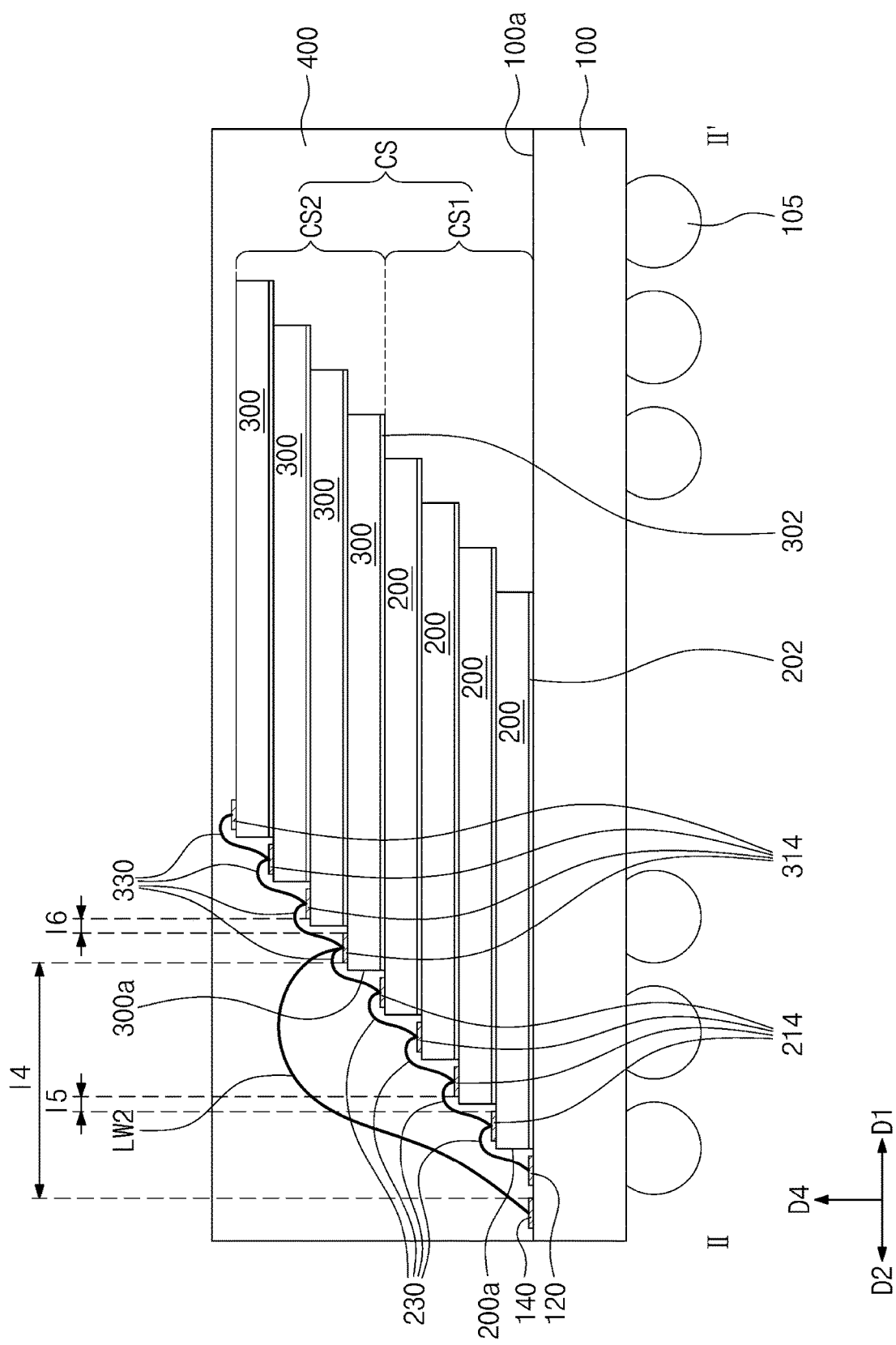

FIG. 1 is a perspective view illustrating a semiconductor package according to some embodiments of the inventive concepts. FIG. 2 is a plan view illustrating a semiconductor package according to some embodiments of the inventive concepts. FIGS. 3 and 4 are cross-sectional views illustrating a semiconductor package according to some embodiments of the inventive concepts. FIG. 3 corresponds to a cross-section taken along line I-I' of FIG. 2, and FIG. 4 corresponds to a cross-section taken along line II-IF of FIG. 2.

Referring to FIGS. 1 to 4, a semiconductor package may include a chip stack CS on a substrate 100 and a molding layer 400 that covers the chip stack CS.

The substrate 100 may be a printed circuit board (PCB) having a signal pattern on a top surface of the printed circuit board. The substrate 100 may have a structure in which one or more dielectric layers and one or more wiring layers are alternately stacked. An external terminal 105 may be provided on a bottom surface of the substrate 100. The external terminal 105 may include a solder ball or a solder pad, and based on type of the external terminal 105, the semiconductor package may include one of a ball grid array (BGA) type, a fine ball-grid array (FBGA) type, and a land grid array (LGA) type.

In this description below, a first direction D1 is defined to refer to a direction parallel to a top surface 100a of the substrate 100, a second direction D2 is defined to refer to a direction opposite to the first direction D1, a third direction D3 is defined to refer to a direction parallel to the top surface 100a of the substrate 100 and orthogonal to the first direction D1 and second direction, and a fourth direction D4 is defined to refer to a direction perpendicular to the top surface 100a of the substrate 100.

The signal pattern of the substrate 100 may include substrate pads 110, 120, 130, and 140. The substrate pads 110, 120, 130, and 140 may include first substrate pads 110 and third substrate pads 130 coupled to a signal input/output circuit of the substrate 100, and may also include second substrate pads 120 and fourth substrate pads 140 coupled to a ground circuit of the substrate 100. The first substrate pads 110 and the second substrate pads 120 may be arranged alternately with each other in the third direction D3. The third substrate pads 130 may each be disposed in the second direction D2 from a single first substrate pad 110. The fourth substrate pads 140 may each be disposed in the second direction D2 from a single second substrate pad 120. The third substrate pads 130 and the fourth substrate pads 140 may be arranged alternately with each other in the third direction D3. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The chip stack CS may be provided on the substrate 100. The chip stack CS may be disposed in the first direction D1 from the first and second substrate pads 110 and 120. For example, the first, second, third, and fourth substrate pads 110, 120, 130, and 140 may be positioned in the second direction D2 from the chip stack CS. The chip stack CS may have semiconductor chips 200 and 300 that constitute a plurality of channels. For example, the chip stack CS may include a first stack CS1 provided on the substrate 100 and a second stack CS2 stacked on the first stack CS1. The first stack CS1 and the second stack CS2 may constitute a single channel. For example, the first stack CS1 may include first semiconductor chips 200 that are stacked in the fourth direction D4, and the second stack CS2 may include second semiconductor chips 300 that are stacked in the fourth direction D4 on an uppermost first semiconductor chip 200 of the first stack CS1. The first and second semiconductor chips 200 and 300 may be memory chips. The first and second semiconductor chips 200 and 300 may be of the same type. The present inventive concepts, however, are not limited thereto, and the first and second semiconductor chips 200 and 300 may be of different types.

The first semiconductor chips 200 of the first stack CS1 may be disposed in an offset stack structure. For example, the first semiconductor chips 200 may be stacked obliquely in the first direction D1 on the substrate 100, and this configuration may form an ascending stepwise shape. The configuration of the first stack CS1 may also be referred to as a cascade stack. A first adhesive layer 202 may be provided between the first semiconductor chips 200. The first semiconductor chips 200 may be attached to top surfaces of other first semiconductor chips 200 through the first adhesive layers 202 provided on bottom surfaces of the first semiconductor chips 200, and a lowermost first semiconductor chip 200 may be attached to the top surface 100a of the substrate 100 through the first adhesive layer 202 provided on a bottom surface of the lowermost first semiconductor chip 200. As the first semiconductor chips 200 are stepwise stacked, the top surfaces of the first semiconductor chips 200 may be partially exposed. FIGS. 1 to 4 depict four first semiconductor chips 200 stacked on the substrate 100, but the present inventive concepts are not limited thereto. The substrate 100 may be provided thereon with a single first semiconductor chip 200 or at least two first semiconductor chips 200.

The exposed top surfaces of the first semiconductor chips 200 may be active surfaces. For example, first chip pads may be provided on the exposed top surfaces of the first semiconductor chips 200. The first chip pads may be arranged along lateral surfaces 200a in the second direction D2 of the first semiconductor chips 200. For example, on the exposed top surfaces of the first semiconductor chips 200, the first chip pads may be disposed adjacent to the lateral surfaces 200a in the second direction D2 of the first semiconductor chips 200, and may be arranged along the third direction D3. The first chip pads may include first input/output pads 212 and first ground pads 214. The first input/output pads 212 and the first ground pads 214 may be disposed alternately along the third direction D3.

The first semiconductor chips 200 may be connected to each other through first connection wires 220 and second connection wires 230. For example, the first connection wires 220 may connect to each other the first input/output pads 212 of the first semiconductor chips 200, and the second connection wires 230 may connect to each other the first ground pads 214 of the first semiconductor chips 200. The first connection wires 220 may sequentially connect each of the first input/output pads 212 of the first semiconductor chips 200. The second connection wires 230 may sequentially connect each of the first ground pads 214 of the first semiconductor chips 200. In this case, the first connection wires 220 may be input/output wires that transfer input/output signals of the first semiconductor chips 200, and the second connection wires 230 may be ground wires that transfer ground signals to the first semiconductor chips 200. For convenience of description, the following embodiment with reference to FIG. 3 or 4 will discuss an electrical connection used by a single first connection wire 220 or a single second connection wire 230.

As shown in FIG. 3, each of the first connection wires 220 may connect the first input/output pad 212 of one first semiconductor chip 200 to the first input/output pad 212 of another first semiconductor chip 200 disposed immediately below the one first semiconductor chip 200. One of the first connection wires 220 may connect the first input/output pad 212 of the lowermost first semiconductor chip 200 to the first substrate pad 110 of the substrate 100. The first semiconductor chips 200 may have their integrated circuits connected to each other through the first connection wires 220, and may constitute a single channel. The first semiconductor chips 200 may be coupled through the first connection wires 220 to the signal input/output circuit of the substrate 100.

As shown in FIG. 4, each of the second connection wires 230 may connect the first ground pad 214 of one first semiconductor chip 200 to the first ground pad 214 of another first semiconductor chip 200 disposed immediately below the one first semiconductor chip 200. One of the second connection wires 230 may connect the first ground pad 214 of the lowermost first semiconductor chip 200 to the second substrate pad 120 of the substrate 100. The first semiconductor chips 200 may be coupled through the second connection wires 230 to the ground circuit of the substrate 100.

Referring back to FIGS. 1 to 4, the second stack CS2 may be stacked on the first stack CS1. The second semiconductor chips 300 of the second stack CS2 may be disposed in an offset stack structure. For example, the second semiconductor chips 300 may be stacked obliquely in the first direction D1 on an uppermost first semiconductor chip 200, and this configuration may form an ascending stepwise shape. The configuration of the second stack CS2 may also be referred to as a cascade stack. Second adhesive layers 302 may be provided between the second semiconductor chips 300. The second semiconductor chips 300 may be attached to top surfaces of other second semiconductor chips 300 through the second adhesive layers 302 provided on bottom surfaces of the second semiconductor chips 300, and a lowermost second semiconductor chip 300 may be attached to a top surface of the uppermost first semiconductor chip 200 included in the first stack CS1 through the second adhesive layer 302 provided on a bottom surface of the lowermost second semiconductor chip 300. As the second semiconductor chips 300 are stepwise stacked, the top surfaces of the second semiconductor chips 300 may be partially exposed. FIGS. 1 to 4 depict four second semiconductor chips 300 stacked on the first stack CS1, but the present inventive concepts are not limited thereto. The first stack CS1 may be provided thereon with a single second semiconductor chip 300 or at least two second semiconductor chips 300.

The exposed top surfaces of the second semiconductor chips 300 may be active surfaces. For example, second chip pads may be provided on the exposed top surfaces of the second semiconductor chips 300. The second chip pads may be arranged along lateral surfaces 300a in the third direction D3 of the second semiconductor chips 300. For example, on the exposed top surfaces of the second semiconductor chips 300, the second chip pads may be disposed adjacent to the lateral surfaces 300a in the second direction D2 of the second semiconductor chips 300, and may be arranged along the third direction D3. The second chip pads may include second input/output pads 312 and second ground pads 314. The second input/output pads 312 and the second ground pads 314 may be disposed alternately along the third direction D3. For convenience of description, the following embodiments with reference to FIG. 3 or 4 will discuss an electrical connection used by a single third connection wire 320 or a single fourth connection wire 330.

The second semiconductor chips 300 may be connected to each other through third connection wires 320 and fourth connection wires 330. For example, the third connection wires 320 may connect to each other the second input/output pads 312 of the second semiconductor chips 300, and the fourth connection wires 330 may connect to each other the second ground pads 314 of the second semiconductor chips 300. The third connection wires 320 may sequentially connect each of the second input/output pads 312 of the second semiconductor chips 300. The fourth connection wires 330 may sequentially connect each of the second ground pads 314 of the second semiconductor chips 300. In this case, the third connection wires 320 may be input/output wires that transfer input/output signals of the second semiconductor chips 300, and the fourth connection wires 330 may be ground wires that transfer ground signals to the second semiconductor chips 300.

As shown in FIG. 3, each of the third connection wires 320 may connect the second input/output pad 312 of one second semiconductor chip 300 to the second input/output pad 312 of another second semiconductor chip 300 disposed immediately below the one second semiconductor chip 300. The second semiconductor chips 300 may have their integrated circuits connected to each other through the third connection wires 320, and may constitute a single channel.

The second semiconductor chips 300 of the second stack CS2 may constitute a separate channel from that of the first semiconductor chips 200 of the first stack CS1, and may be electrically floated from the first semiconductor chips 200. Referring still to FIG. 3, first additional wires LW1 may be used to couple the second semiconductor chips 300 to the substrate 100. For example, the first additional wires LW1 may directly connect the second input/output pads 312 of the lowermost second semiconductor chip 300 to the third substrate pads 130 of the substrate 100. As used herein, "directly connect" means that there are no intervening elements in the connection. For example, in this specific embodiment, there are no intervening elements between the second input/output pads 312 of the lowermost second semiconductor chip to the third substrate pads 130 of the substrate 100 along the first additional wires LW1. The second semiconductor chips 300 may be coupled to the signal input/output circuit of the substrate 100 through the third connection wires 320 and the first additional wires LW1. Because the first additional wires LW1 are coupled to the lowermost second semiconductor chip 300, the first additional wires LW1 may have small lengths and the semiconductor package may have increased electrical characteristics.

The lengths of the first additional wires LW1 may be greater than those of the first connection wires 220 and those of the third connection wires 320. For example, a first distance 11 in the first direction D1 between the third substrate pads 130 of the substrate 100 and the second input/output pads 312 of the lowermost second semiconductor chip 300 to which the first additional wires LW1 are coupled may be about 2 to 16 times a second distance 12 between the first input/output pads 212 to which the first connection wires 220 are correspondingly coupled or a third distance 13 between the second input/output pads 312 to which the connection wires 320 are correspondingly coupled. The lengths of the first additional wires LW1 may be about 2 to 16 times the lengths of the first connection wires 220 and the lengths of the third connection wires 320.

As shown in FIG. 4, each of the fourth connection wires 330 may connect the second ground pad 314 of one second semiconductor chip 300 to the second ground pad 314 of another second semiconductor chip 300 disposed immediately below the one second semiconductor chip 300. One of the fourth connection wires 330 may connect the second ground pad 314 of the lowermost second semiconductor chip 300 to the first ground pad 214 of the uppermost first semiconductor chip 200. The second semiconductor chips 300 may be coupled to the ground circuit of the substrate 100 through the fourth connection wires 330 and the second connection wires 230.

The semiconductor package may further include second additional wires LW2. Referring still to FIG. 4, the second additional wires LW2 may directly connect the second ground pads 314 of the lowermost second semiconductor chip 300 to the fourth substrate pads 140 of the substrate 100. The second semiconductor chips 300 may be coupled to the ground circuit of the substrate 100 through the fourth connection wires 330 and the second connection wires 230. Additionally, the second semiconductor chips 300 may also be coupled to the ground circuit of the substrate 100 through the fourth connection wires 330 and the second additional wires LW2. When viewed in plan and along the first direction D1, the first ground pads 214 of the first semiconductor chips 200 may be positioned between the second ground pads 314 and the fourth substrate pads 140 to which the second additional wires LW2 are coupled.

According to some embodiments of the inventive concepts, the second semiconductor chips 300 of the second stack CS2 may be coupled to the substrate 100 through not only the second connection wires 230 and the fourth connection wires 330, but also the second additional wires LW2 that directly connect one of the second semiconductor chips 300 to the substrate 100. Therefore, a short electrical connection may be provided between the substrate 100 and the second semiconductor chips 300, and the semiconductor package may increase in electrical characteristics. In addition, the first and second semiconductor chips 200 and 300 may be coupled to the ground circuit of the substrate 100 through two paths including a first path that reaches the substrate 100 through the second connection wires 230 and a second path that reaches the substrate 100 through the second additional wires LW2. Accordingly, electrical stability may be improved in grounding the first and second semiconductor chips 200 and 300.

The second additional wires LW2 may have their lengths greater than those of the second connection wires 230 and those of the fourth connection wires 330. For example, a fourth distance 14 in the first direction D1 between the fourth substrate pads 140 of the substrate 100 and the second ground pads 314 of the lowermost second semiconductor chip 300 to which the second additional wires LW2 are coupled may be about 2 to 16 times a fifth distance 15 between the first ground pads 214 to which the second connection wires 230 are correspondingly coupled or a sixth distance 16 between the second ground pads 314 to which the fourth connection wires 330 are correspondingly coupled. The lengths of the second additional wires LW2 may be about 2 to 16 times the lengths of the second connection wires 230 and the lengths of the fourth connection wires 330.

Referring back to FIGS. 1 to 4, as the second semiconductor chips 300 of the second stack CS2 have the second input/output pads 312 and the second ground pads 314 that are disposed alternately along the third direction D3, the first additional wires LW1 and the second additional wires LW2 may also be disposed alternately along the third direction D3. For example, the first additional wires LW1 may be arranged along the third direction D3, and each of the second additional wires LW2 may be disposed between neighboring first additional wires LW1.

When the semiconductor package operates, input/output signals transferred through the first additional wires LW1 may generate electromagnetic waves at the first additional wires LW1, and the electromagnetic waves may affect the input/output signals of the first additional wires LW1. According to some example embodiments of the present inventive concepts, the second additional wires LW2 that transmit ground signals may be disposed between the first additional wires LW1 that transmit the input/output signals. Therefore, a shield effect of the second additional wires LW2 may minimize or prevent the input/output signals of the first additional wires LW1 from interference caused by the electromagnetic waves produced from the first additional wires LW1.

The molding layer 400 may be provided to cover the chip stack CS and the top surface 100a of the substrate 100. The molding layer 400 may include a dielectric polymeric material, such as an epoxy molding compound (EMC).

Figure 5:
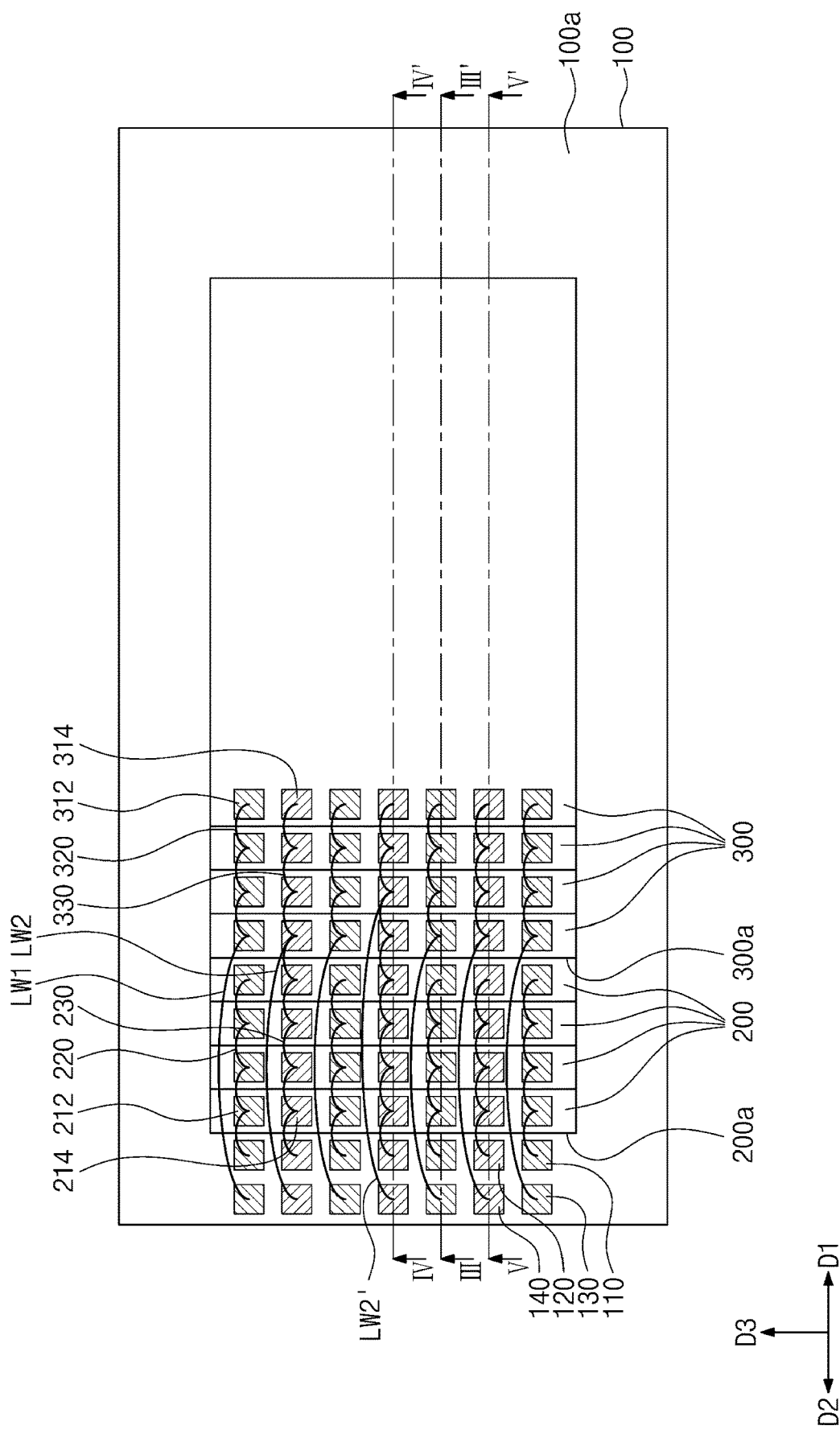
FIG. 5 is a plan view illustrating a semiconductor package according to some embodiments of the inventive concepts.
Figure 6:
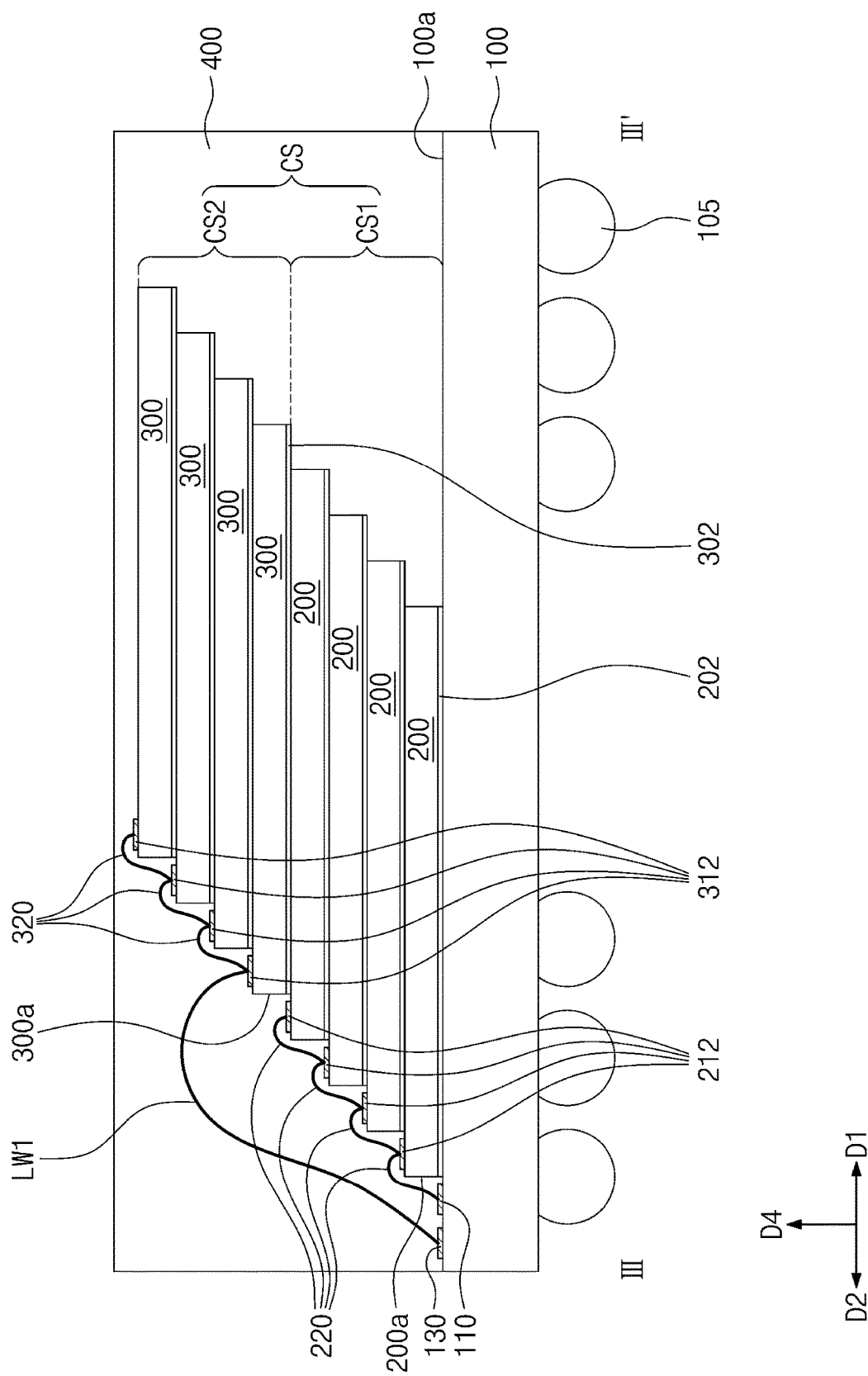
FIGS. 6 to 8 are cross-sectional views illustrating a semiconductor package according to some embodiments of the inventive concepts.
Figure 7:
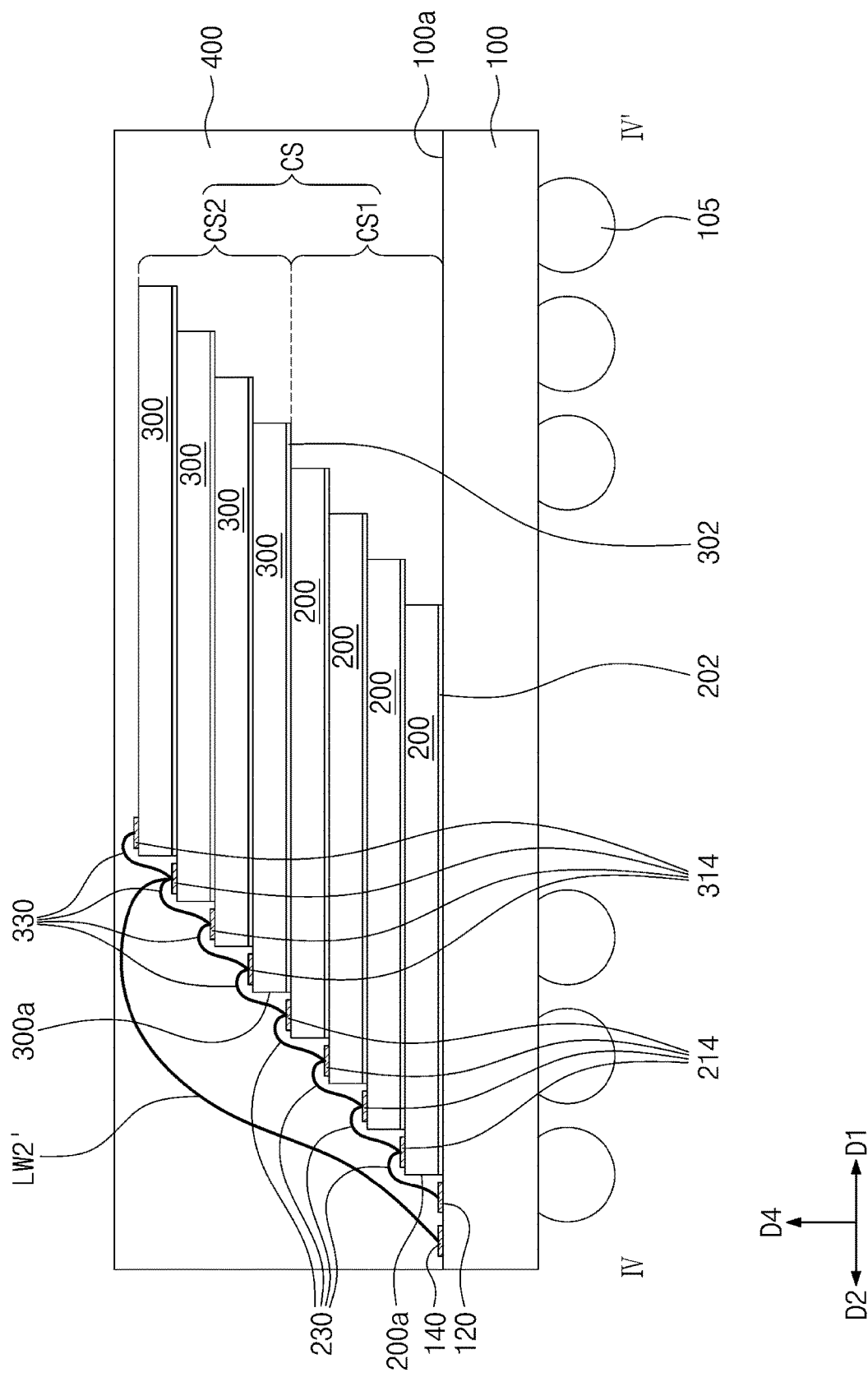
Figure 8:
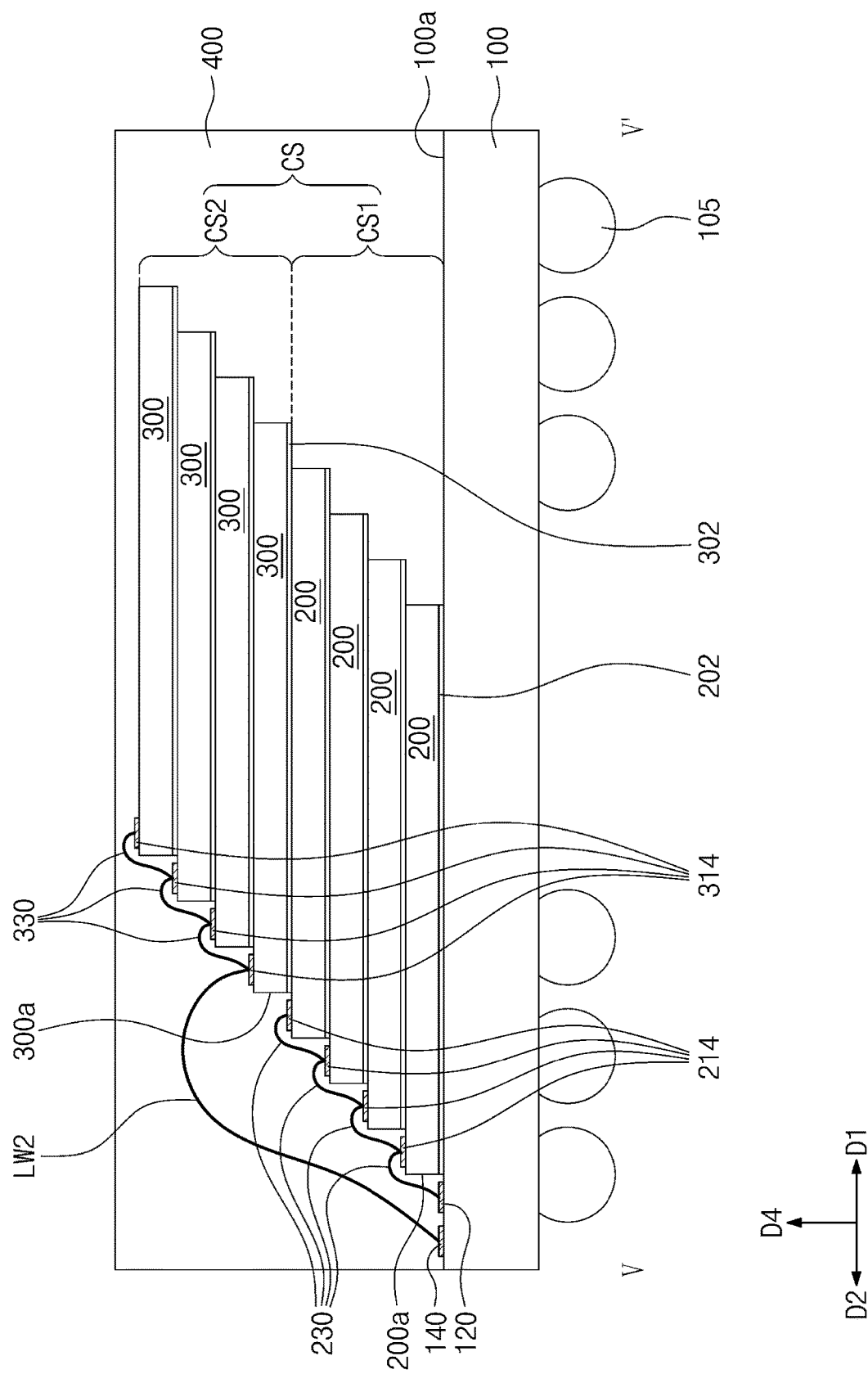

FIG. 5 is a plan view illustrating a semiconductor package according to some embodiments of the inventive concepts. FIGS. 6 to 8 are cross-sectional views illustrating a semiconductor package according to some embodiments of the inventive concepts. FIG. 6 corresponds to a cross-section taken along line of FIG. 5, FIG. 7 corresponds to a cross-section taken along line IV-IV' of FIG. 5, and FIG. 8 corresponds to a cross-section taken along line V-V' of FIG. 5. In the embodiment that follows, a detailed description of technical features repetitive to those discussed with reference to FIGS. 1 to 4 will be omitted for convenience of description, and a difference thereof will be discussed in detail. The same reference numeral will be allocated to the same component of the semiconductor package discussed above according to some embodiments of the inventive concepts.

Referring to FIG. 5, the substrate 100 may include first substrate pads 110 and third substrate pads 130 coupled to a signal input/output circuit of the substrate 100, and may also include second substrate pads 120 and fourth substrate pads 140 coupled to a ground circuit of the substrate 100.

A chip stack CS may be provided on the substrate 100. The chip stack CS may include a first stack CS1 including first semiconductor chips 200 stacked on the substrate 100 and a second stack CS2 including second semiconductor chips 300 stacked on the first stack CS1. The first semiconductor chips 200 may be provided on their exposed top surfaces with first input/output pads 212 and first ground pads 214. The second semiconductor chips 300 may be provided on their exposed top surfaces with second input/output pads 312 and second ground pads 314.

Referring to FIGS. 5 and 6, each of first connection wires 220 may connect the first input/output pad 212 of one first semiconductor chip 200 to the first input/output pad 212 of another first semiconductor chip 200 disposed immediately below the one first semiconductor chip 200. One of the first connection wires 220 may connect the first input/output pad 212 of a lowermost first semiconductor chip 200 to the first substrate pad 110 of the substrate 100.

Each of third connection wires 320 may connect the second input/output pad 312 of one second semiconductor chip 300 to the second input/output pad 312 of another second semiconductor chip 300 disposed immediately below the one second semiconductor chip 300. First additional wires LW1 may be used to couple the second semiconductor chips 300 to the substrate 100. For example, the first additional wires LW1 may connect the second input/output pads 312 of a lowermost second semiconductor chip 300 to the third substrate pads 130 of the substrate 100.

Referring to FIGS. 5 and 7, each of second connection wires 230 may connect the first ground pad 214 of one first semiconductor chip 200 to the first ground pad 214 of another first semiconductor chip 200 disposed immediately below the one first semiconductor chip 200. One of the second connection wires 230 may connect the first ground pad 214 of the lowermost first semiconductor chip 200 to the second substrate pad 120 of the substrate 100.

Each of fourth connection wires 330 may connect the second ground pad 314 of one second semiconductor chip 300 to the second ground pad 314 of another second semiconductor chip 300 disposed immediately below the one second semiconductor chip 300. One of the fourth connection wires 330 may connect the second ground pad 314 of the lowermost second semiconductor chip 300 to the first ground pad 214 of an uppermost first semiconductor chip 200.

Second additional wires LW2' may connect the second ground pads 314 of one second semiconductor chip 300 to the fourth substrate pads 140 of the substrate 100. In this case, as shown in FIG. 7, the second semiconductor chip 300 to which the second additional wires LW2' are coupled may not be the lowermost second semiconductor chip 300. The second additional wires LW2' may be coupled to one of the second semiconductor chips 300 that is positioned between the lowermost and uppermost second semiconductor chips 300 of the second stack CS2. Also, in a different embodiment from that shown in FIG. 7, the second additional wires LW2' may be coupled to the uppermost second semiconductor chip 300 of the second stack CS2.

FIG. 7 depicts that the second ground pads 314 of the second semiconductor chips 300 included in the second stack CS2 are connected through the fourth connection wires 330 to the first ground pads 214 of the first semiconductor chips 200, but the present inventive concepts are not limited thereto. Referring to FIGS. 5 and 8, the second semiconductor chips 300 of the second stack CS2 may constitute a separate channel from that of the first semiconductor chips 200 of the first stack CS1, and ground circuits of the second semiconductor chips 300 may be electrically floated from those of the first semiconductor chips 200. For example, one of the fourth connection wires 330 which connects the second ground pad 314 of the lowermost second semiconductor chip 300 to the first ground pad 214 of the uppermost first semiconductor chip 200 may not be provided. Therefore, it may be possible to separately control the first semiconductor chips 200 of the first stack CS1 and the second semiconductor chips 300 of the second stack CS2.

A molding layer 400 may be provided to cover the chip stack CS and a top surface 100a of the substrate 100.

Figure 9:
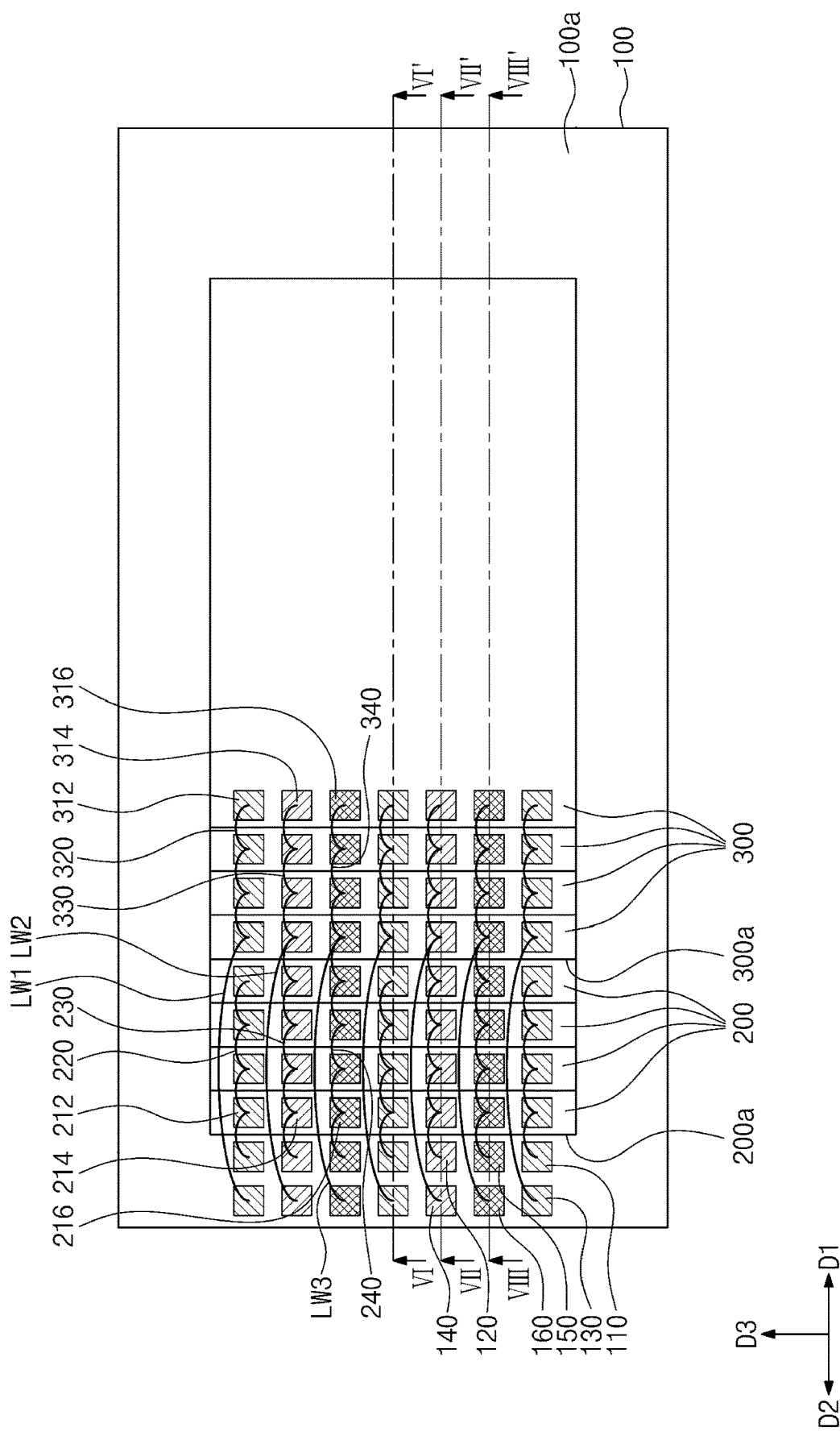
FIG. 9 is a plan view illustrating a semiconductor package according to some embodiments of the inventive concepts.
Figure 10:
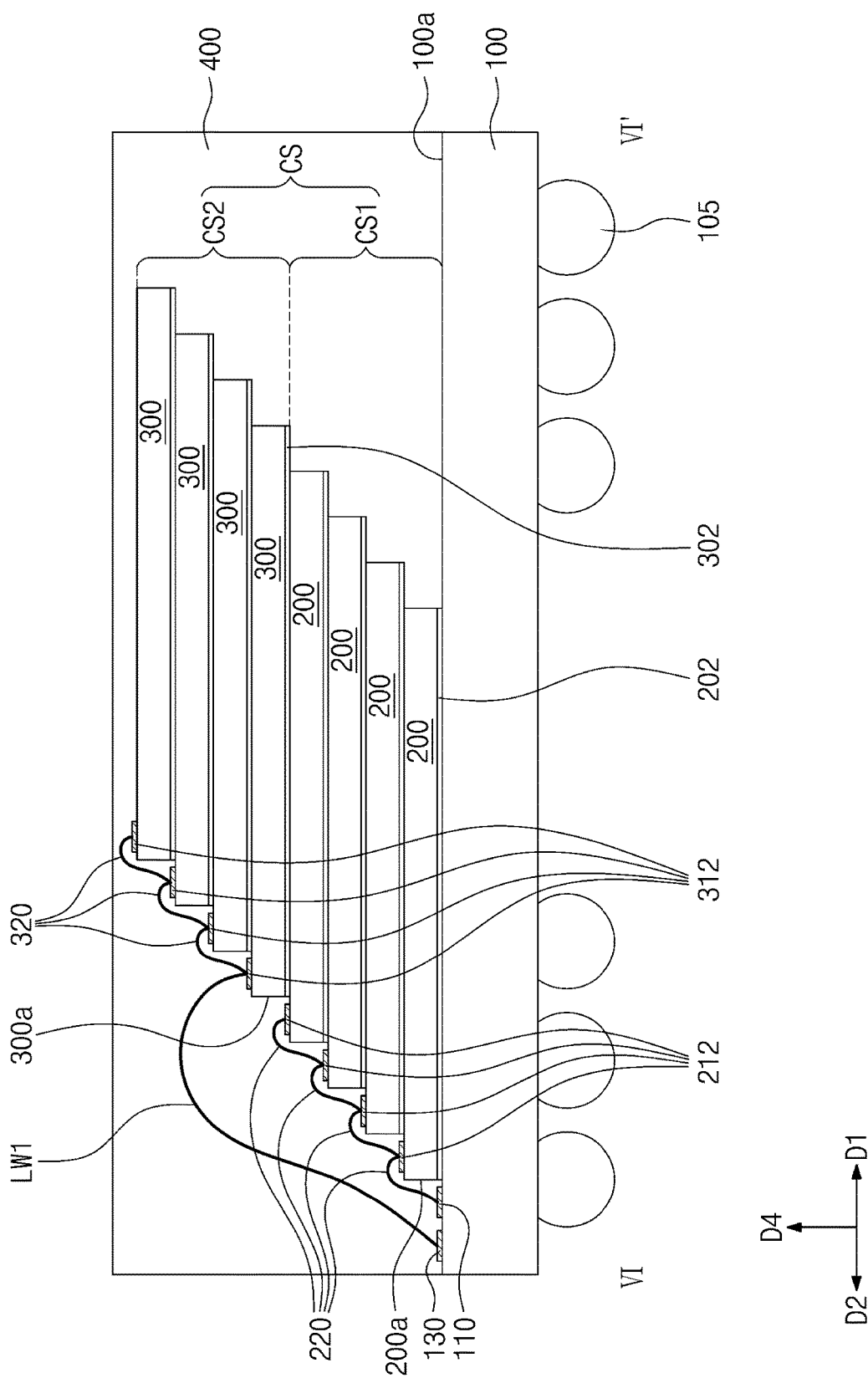
FIGS. 10 to 12 are cross-sectional views illustrating a semiconductor package according to some embodiments of the inventive concepts.
Figure 11:
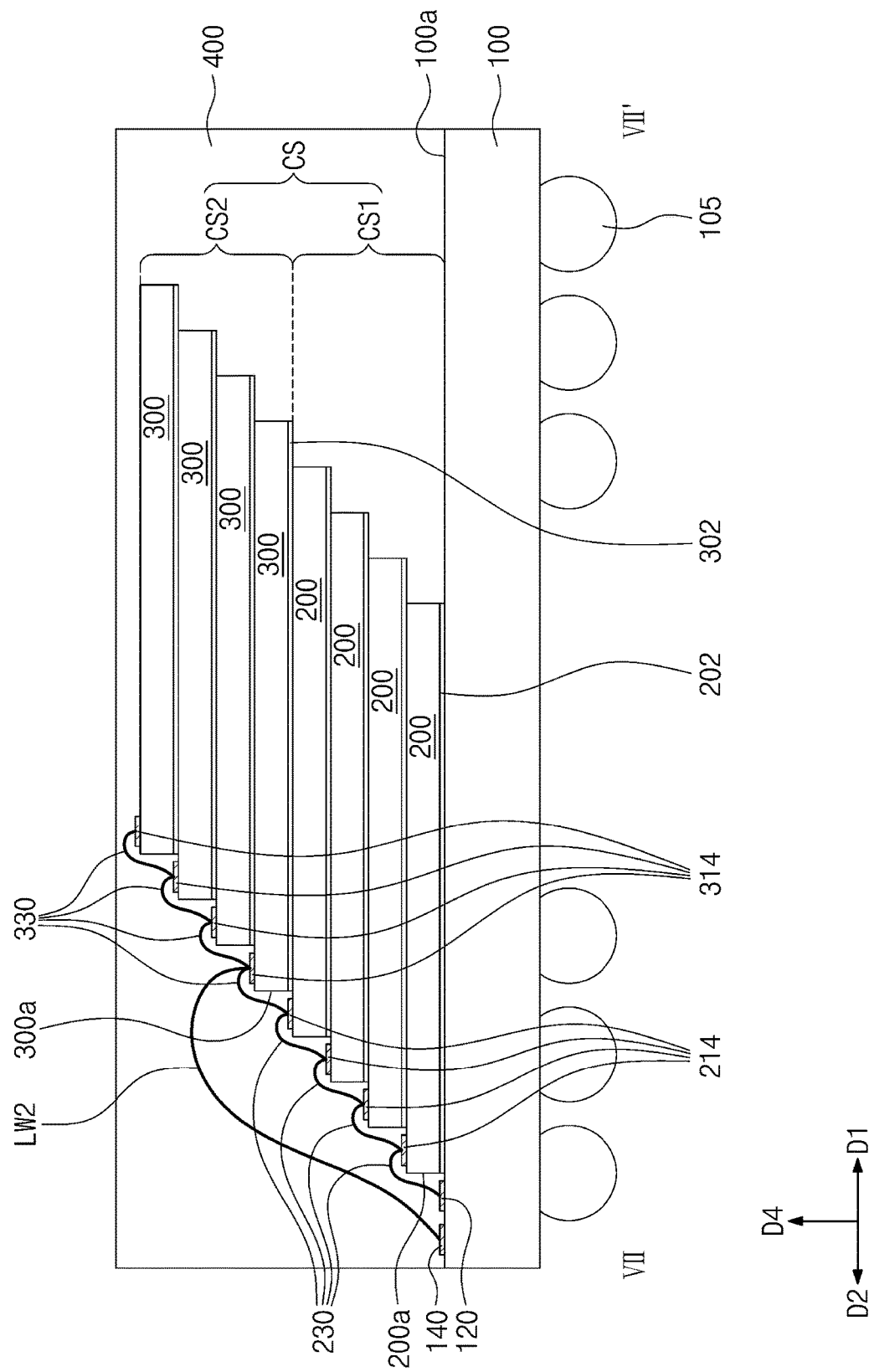
Figure 12:
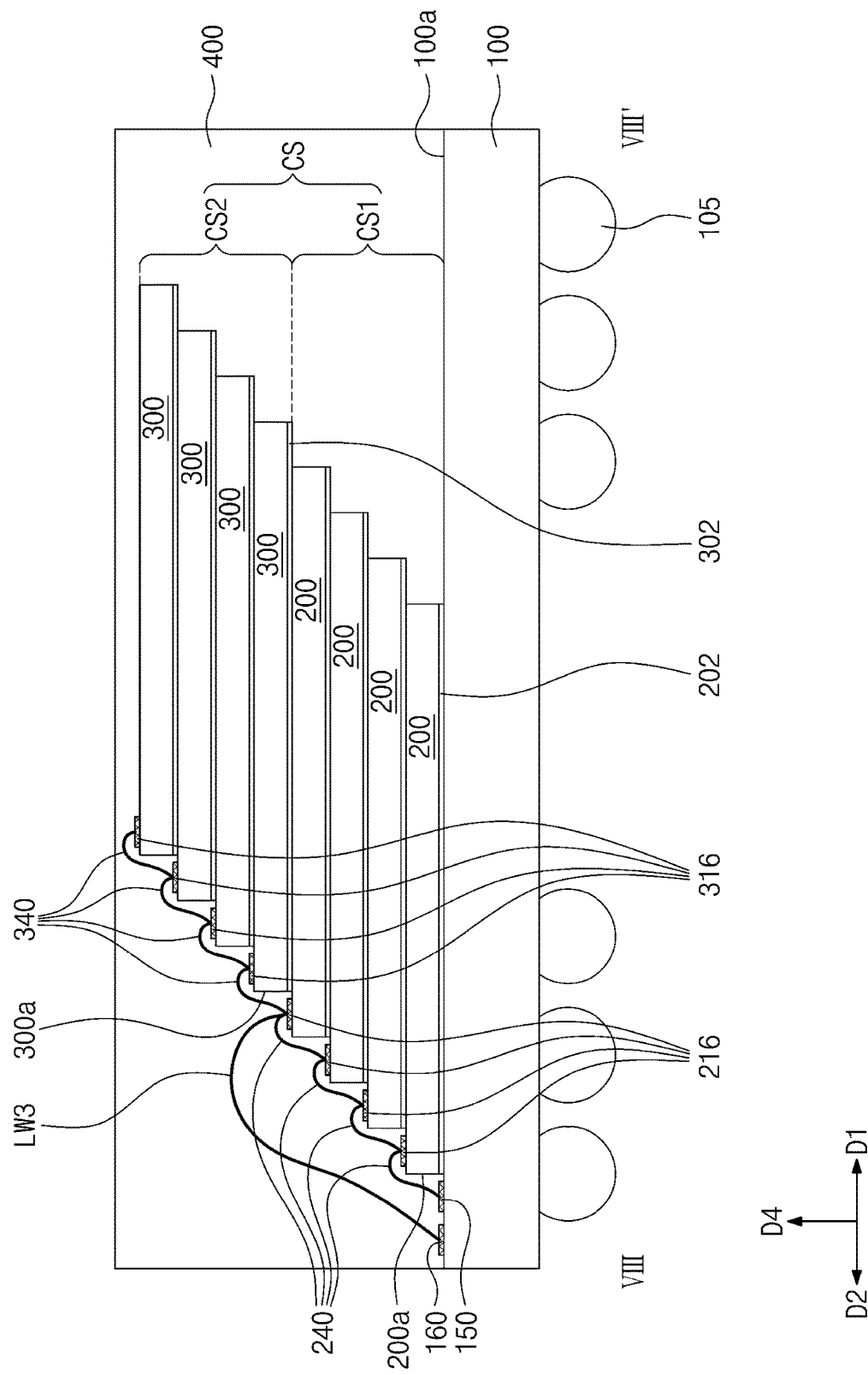

FIG. 9 is a plan view illustrating a semiconductor package according to some example embodiments of the inventive concepts. FIGS. 10 to 12 are cross-sectional views illustrating a semiconductor package according to some embodiments of the inventive concepts. FIG. 10 corresponds to a cross-section taken along line VI-VI' of FIG. 9, FIG. 11 corresponds to a cross-section taken along line VII-VII' of FIG. 9, and FIG. 12 corresponds to a cross-section taken along line VIII-VIII' of FIG. 9.

Referring to FIG. 9, a substrate 100 may be a printed circuit board (PCB) having a signal pattern on a top surface of the printed circuit board. The signal pattern of the substrate 100 may include substrate pads 110, 120, 130, 140, 150, and 160. The substrate pads 110, 120, 130, 140, 150, and 160 may include first substrate pads 110 and third substrate pads 130 coupled to a signal input/output circuit of the substrate 100, second substrate pads 120 and fourth substrate pads 140 coupled to a ground circuit of the substrate 100, and fifth substrate pads 150 and sixth substrate pads 160 coupled to a power circuit of the substrate 100. The first substrate pads 110, the second substrate pads 120, and the fifth substrate pads 150 may be arranged alternately in the third direction D3. For example, the second substrate pads 120 and the fifth substrate pads 150 may be provided between neighboring first substrate pads 110. The third substrate pads 130 may each be disposed in the second direction D2 from a single first substrate pad 110. The fourth substrate pads 140 may each be disposed in the second direction D2 from a single second substrate pad 120. The sixth substrate pads 160 may each be disposed in the second direction D2 from a single fifth substrate pad 150. The third substrate pads 130, the fourth substrate pads 140, and the sixth substrate pads 160 may be arranged alternately in the third direction D3. For example, the fourth substrate pads 140 and the sixth substrate pads 160 may be provided between neighboring third substrate pads 130.

A chip stack CS may be provided on the substrate 100. The chip stack CS may include a first stack CS1 including first semiconductor chips 200 stacked on the substrate 100 and a second stack CS2 including second semiconductor chips 300 stacked on the first stack CS1.

The first semiconductor chips 200 may be provided on their exposed top surfaces with first input/output pads 212, first ground pads 214, and first power pads 216. The first input/output pads 212, the first ground pads 214, and the first power pads 216 may be disposed alternately along the third direction D3. The power pads and ground pads of each semiconductor chip may connect to an internal power supply of the semiconductor chip to provide power (e.g., in the form of a voltage) from an external source (e.g., a power supply external to the semiconductor package) to the internal power supply. The internal power supply may be a circuit forming a voltage regulator to provide a regulated voltage to operate internal circuits of the integrated circuit of the semiconductor chip. Several different external voltages of different magnitudes may be supplied and regulated. The voltage supplied to the internal power supply by the power pads and ground pads may be defined by the potential difference between a power pad and a ground pad. It should also be appreciated that the ground pad need not supply a ground voltage of zero volts, but may provide a ground voltage having a magnitude other than zero (e.g., 0.5 volts, −0.5 volts, etc.).

The input/output pads may provide signals to communicate information and/or provide control signals between the semiconductor chip and an external source (which may be a source external to the semiconductor package, such as a controller or host, or may be one of the other semiconductor chips within the package). The input/output pads may provide addresses, commands and data via an interface of the semiconductor chip such as via a buffer circuit (an input buffer or output buffer in dependence in the direction of communication of the information). For example, I/O pads may provide addresses to an input buffer that are latched by latches of the address buffer and then provided to an address decoder of the semiconductor chip. Data may be latched by a data buffer and provided to a memory or other circuit of the semiconductor chip identified by the address. An internal control logic circuit of the semiconductor chip may receive commands via the I/O pads of the semiconductor chip and decode the command to control the operation corresponding to the received command (e.g., a read operation, write operation, etc.).

The first semiconductor chips 200 may be connected to each other through first connection wires 220, second connection wires 230, and fifth connection wires 240. For example, the first connection wires 220 may connect to each other the first input/output pads 212 of the first semiconductor chips 200, the second connection wires 230 may connect to each other the first ground pads 214 of the first semiconductor chips 200, and the fifth connection wires 240 may connect to each other the first power pads 216 of the first semiconductor chips 200. The fifth connection wires 240 may sequentially connect each of the first power pads 216 of the first semiconductor chips 200.

As shown in FIG. 10, each of the first connection wires 220 may connect the first input/output pad 212 of one first semiconductor chip 200 to the first input/output pad 212 of another first semiconductor chip 200 disposed immediately below the one first semiconductor chip 200. One of the first connection wires 220 may connect the first input/output pad 212 of a lowermost first semiconductor chip 200 to the first substrate pad 110 of the substrate 100. The first semiconductor chips 200 may be coupled through the first connection wires 220 to the signal input/output circuit of the substrate 100.

As shown in FIG. 11, each of the second connection wires 230 may connect the first ground pad 214 of one first semiconductor chip 200 to the first ground pad 214 of another first semiconductor chip 200 disposed immediately below the one first semiconductor chip 200. One of the second connection wires 230 may connect the first ground pad 214 of the lowermost first semiconductor chip 200 to the second substrate pad 120 of the substrate 100. The first semiconductor chips 200 may be coupled through the second connection wires 230 to the ground circuit of the substrate 100.

As shown in FIG. 12, each of the fifth connection wires 240 may connect the first power pad 216 of one first semiconductor chip 200 to the first power pad 216 of another first semiconductor chip 200 disposed immediately below the one first semiconductor chip 200. One of the fifth connection wires 240 may connect the first power pad 216 of the lowermost first semiconductor chip 200 to the fifth substrate pad 150 of the substrate 100. The first semiconductor chips 200 may be coupled through the fifth connection wires 240 to the power circuit of the substrate 100.

Referring back to FIG. 9, the second semiconductor chips 300 may be provided on their exposed top surfaces with second input/output pads 312, second ground pads 314, and second power pads 316. The second input/output pads 312, the second ground pads 314, and the second power pads 316 may be disposed alternately along the third direction D3.

The second semiconductor chips 300 may be connected to each other through third connection wires 320, fourth connection wires 330, and sixth connection wires 340. For example, the third connection wires 320 may connect to each other the second input/output pads 312 of the second semiconductor chips 300, the fourth connection wires 330 may connect to each other the second ground pads 314 of the second semiconductor chips 300, and the sixth connection wires 340 may connect to each other the second power pads 316 of the second semiconductor chips 300. The sixth connection wires 340 may sequentially connect each of the second power pads 316 of the second semiconductor chips 300.

As shown in FIG. 10, each of the third connection wires 320 may connect the second input/output pad 312 of one second semiconductor chip 300 to the second input/output pad 312 of another second semiconductor chip 300 disposed immediately below the one second semiconductor chip 300. First additional wires LW1 may be used to couple the second semiconductor chips 300 to the substrate 100. For example, the first additional wires LW1 may connect the second input/output pads 312 of a lowermost second semiconductor chip 300 to the third substrate pads 130 of the substrate 100. The second semiconductor chips 300 may be coupled to the signal input/output circuit of the substrate 100 through the third connection wires 320 and the first additional wires LW1. Because the first additional wires LW1 are coupled to the lowermost second semiconductor chip 300, the first additional wires LW1 may have small lengths and the semiconductor package may have increased electrical characteristics.

As shown in FIG. 11, each of the fourth connection wires 330 may connect the second ground pad 314 of one second semiconductor chip 300 to the second ground pad 314 of another second semiconductor chip 300 disposed immediately below the one second semiconductor chip 300. One of the fourth connection wires 330 may connect the second ground pad 314 of the lowermost second semiconductor chip 300 to the first ground pad 214 of an uppermost first semiconductor chip 200. The second semiconductor chips 300 may be coupled to the ground circuit of the substrate 100 through the fourth connection wires 330 and the second connection wires 230.

Second additional wires LW2 may connect the second ground pads 314 of the lowermost second semiconductor chip 300 to the fourth substrate pads 140 of the substrate 100. The second semiconductor chips 300 may be coupled to the ground circuit of the substrate 100 through the fourth connection wires 330 and the second connection wires 230. Additionally, the second semiconductor chips 300 may also be coupled to the ground circuit of the substrate 100 through the fourth connection wires 330 and the second additional wires LW2. Therefore, a short electrical connection may be provided between the substrate 100 and the second semiconductor chips 300. When viewed in plan and along the first direction D1, the first ground pads 214 of the first semiconductor chips 200 may be positioned between the second ground pads 314 and the fourth substrate pads 140 to which the second additional wires LW2 are coupled.

As shown in FIG. 12, each of the sixth connection wires 340 may connect the second power pad 316 of one second semiconductor chip 300 to the second power pad 316 of another second semiconductor chip 300 disposed immediately below the one second semiconductor chip 300. One of the sixth connection wires 340 may connect the second power pad 316 of the lowermost second semiconductor chip 300 to the first power pad 216 of the uppermost first semiconductor chip 200. The second semiconductor chips 300 may be coupled to the power circuit of the substrate 100 through the fifth connection wires 240 and the sixth connection wires 340.

The semiconductor package may further include third additional wires LW3. The third additional wires LW3 may directly connect the second power pads 316 of the lowermost second semiconductor chip 300 to the sixth substrate pads 160 of the substrate 100. The second semiconductor chips 300 may be coupled to the power circuit of the substrate 100 through the sixth connection wires 340 and the fifth connection wires 240. Additionally, second semiconductor chips 300 may also be coupled to the power circuit of the substrate through the sixth connection wires 340 and the third additional wires LW3. When viewed in plan and along the first direction D1, the first power pads 216 of the first semiconductor chips 200 may be positioned between the second power pads 316 and the sixth substrate pads 160 to which the third additional wires LW3 are coupled.

According to some example embodiments of the present inventive concepts, the second semiconductor chips 300 of the second stack CS2 may be coupled to the substrate 100 through not only the fifth connection wires 240 and the sixth connection wires 340, but also the third additional wires LW3 that directly connect one of the second semiconductor chips 300 to the substrate 100. Therefore, a short electrical connection may be provided between the substrate 100 and the second semiconductor chips 300, and the semiconductor package may increase in electrical characteristics.

In addition, the first additional wires LW1 that transmit input/output signals may have therebetween the second additional wires LW2 that transmit ground signals and the third additional wires LW3 that transmit power signals, and it may be possible to minimize or prevent the input/output signals of the first additional wires LW1 from interference caused by electromagnetic waves produced from the first additional wires LW1.

A molding layer 400 may be provided to cover the chip stack CS and a top surface 100a of the substrate 100.

Although not shown, the semiconductor package may not include the second additional wires LW2. Therefore, only the third additional wires LW3 may be provided between the first additional wires LW1, and may minimize or prevent interference between the input/output signals of the first additional wires LW2.

A semiconductor package according to some embodiments of the inventive concepts may be configured such that lower semiconductor chips of a chip stack are coupled to a substrate not though connection wires that connect upper semiconductor chips of the chip stack, but through long wires that directly connect the substrate to one of the upper semiconductor chips of the chip stack. Therefore, a short electrical connection may be provided between the upper semiconductor chips of the chip stack, and the semiconductor package may increase in electrical characteristics. In addition, the semiconductor chips may be coupled through two paths to a ground circuit of the substrate, and thus electrical stability may be improved.

According to some embodiments, long wires for transmitting ground signals may be disposed between long wires for transmitting input/output signals, and the input/output signals of the long wires may be minimized or prevented from interference caused by electromagnetic waves generated from the long wires for transmitting the input/output signals.

As used herein, the term "power/ground" means power or ground. For example, the phrase "power/ground pads" means power pads or ground pads. In another example, the phrase "power/ground wires" means power wires or ground wires.

Although the inventive concepts have been described in connection with some embodiments of the inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
   a substrate including a plurality of first power/ground pads and second power/ground pads;
   a chip stack including a plurality of semiconductor chips that are stacked in a first direction in an ascending stepwise shape along a second direction on the substrate, each of the plurality of semiconductor chips including a plurality of third power/ground pads;
   a plurality of first power/ground wires that connect the first power/ground pads of the substrate to the third power/ground pads of a lowermost semiconductor chip of the chip stack and connect the third power/ground pads of neighboring semiconductor chips of the chip stack to each other; and
   a second power/ground wire that extends from the third power/ground pad of a first semiconductor chip of the chip stack and is directly connected to a second power/ground pad of the substrate, and the first semiconductor chip being one semiconductor chip other than the lowermost semiconductor chip and an uppermost semiconductor chip of the chip stack,
   wherein the chip stack includes a first stack and a second stack on the first stack, the second stack constituting a channel that is separate from a channel of the first stack, and
   wherein the first power/ground pads are disposed between the chip stack and the second power/ground pads in the second direction.

2. The semiconductor package of claim 1, further comprising:
   a plurality of first input/output pads and a plurality of second input/output pads included on the substrate;
   a plurality of third input/output pads including on each of the plurality of semiconductor chips;
   a plurality of first input/output wires that connect the first input/output pads of the substrate to the third input/output pads of the lowermost semiconductor chip of the first stack and connect the third input/output pads of neighboring semiconductor chips of the first stack to each other;
   a plurality of second input/output wires that connect the third input/output pads of neighboring semiconductor chips of the second stack to each other; and
   a third input/output wire that connects the third input/output pads of a semiconductor chip included in the first stack to the third input/output pads of a second semiconductor chip included in the second stack.

3. The semiconductor package of claim 2, wherein the first semiconductor chip is the second semiconductor chip.

4. The semiconductor package of claim 2, wherein the first semiconductor chip is at a level in the first direction different from a level of the second semiconductor chip.

5. The semiconductor package of claim 2, wherein
the semiconductor chips of the first stack form a first channel that is constituted by the first input/output wires,
the semiconductor chips of the second stack form a second channel that is constituted by the second input/output wires, and
the first channel and the second channel are electrically floated from each other.

6. The semiconductor package of claim 2, wherein the third input/output wire is provided in plural, the plurality of third input/output wires being connected to corresponding third input/output chip pads of the second semiconductor chip,
wherein the second power/ground wire is between the third input/output wires.

7. The semiconductor package of claim 1, wherein
the second power/ground pad of the substrate is farther away in the second direction from the chip stack than the first power/ground pad of the substrate is from the chip stack.

8. The semiconductor package of claim 7, wherein a distance between the second power/ground pad of the substrate and the third power/ground pad of the first semiconductor chip is about 2 to 16 times a distance between the third power/ground pads of neighboring semiconductor chips, the second power/ground wire being connected to the third power/ground pad of the first semiconductor chip.

9. The semiconductor package of claim 7, wherein a length of the second power/ground wire is about 2 to 16 times a length of the first power/ground wire.

10. A semiconductor package, comprising:
a substrate including a plurality of first power/ground pads, a plurality of second power/ground pads, a plurality of first input/output pads, and a plurality of second input/output pads;
a chip stack including a plurality of semiconductor chips that are stacked in a first direction and disposed in an offset stack structure along a second direction on the substrate, each of the plurality of semiconductor chips including a plurality of third power/ground pads and a plurality of third input/output pads;
a first power/ground wire that directly connects one of the first power/ground pads of the substrate to one of the third power/ground pads of a first semiconductor chip included in the plurality of semiconductor chips, other than a lowermost and an uppermost ones of the semiconductor chips of the chip stack; and
a plurality of first input/output wires that each directly connects the first input/output pads of the substrate to the third input/output pads of a second semiconductor chip included in the plurality of semiconductor chips, other than the lowermost and uppermost ones of the semiconductor chips of the chip stack,
wherein, when viewed in plan, the first power/ground wire is positioned between the first input/output wires.

11. The semiconductor package of claim 10, further comprising:
a plurality of second power/ground wires that connect second power/ground pads of the substrate to the third power/ground pads of a lowermost semiconductor chip of the chip stack and connect the third power/ground pads of neighboring semiconductor chips of the chip stack to each other;
a plurality of second input/output wires that connect second input/output pads of the substrate to the third input/output pads of a lowermost semiconductor chip of the chip stack and connect the third input/output pads of neighboring semiconductor chips of the chip stack below the second semiconductor chip in the stack; and
a plurality of third input/output wires that connect the third input/output pads of the second semiconductor chip to the third input/output pads of the semiconductor chips positioned above the second semiconductor chip in the stack.

12. The semiconductor package of claim 11, wherein
the first plurality of first input/out pads of the substrate are farther away in the second direction from the chip stack than the first plurality of second input/out pads of the substrate are from the chip stack.

13. The semiconductor package of claim 11, wherein
the semiconductor chips positioned below the second semiconductor chip form a first channel that is constituted by the plurality of second input/output wires,
the semiconductor chips positioned above the second semiconductor chip form a second channel that is constituted by the plurality of third input/output wires, and
the first channel and the second channel are electrically floated from each other.

14. The semiconductor package of claim 10, wherein the first semiconductor chip corresponds to the second semiconductor chip.

15. The semiconductor package of claim 10, wherein the first semiconductor chip and the second semiconductor chip are at different levels from each other in the first direction.

16. A semiconductor package, comprising:
a substrate including a plurality of first power/ground pads, a plurality of second power/ground pads, a plurality of first input/output pads, and a plurality of second input/output pads;
a first stack including a plurality of first semiconductor chips that are stacked in a first direction on the substrate;
a second stack including a plurality of second semiconductor chips that are stacked in the first direction on the first stack, each of the plurality of first semiconductor chips and the plurality of second semiconductor chips include a plurality of third power/ground pads and a plurality of third input/output pads;
a plurality of first input/output wires that connect the third input/output pads of neighboring first semiconductor chips;
a plurality of second input/output wires that connect the third input/output pads of neighboring second semiconductor chips to each other;
a plurality of first power/ground wires that connect the third power/ground pads of neighboring first semiconductor chips and neighboring second semiconductor chips;
a third input/output wire that directly connects a third input/output pad of one of the second semiconductor chips to one of the plurality of second input/output pads of the substrate;
a second power/ground wire that directly connects a third power/ground pad of the one of the second semiconductor chips to one of the plurality of second power/ground pads of the substrate; and
a molding layer on the substrate, the molding layer covering the first stack and the second stack.

17. The semiconductor package of claim 16, wherein
the plurality of second power/ground pads are farther away in a second direction, perpendicular to the first direction, than the plurality of first power/ground pads from the first stack, and
the plurality of second input/output pads are farther away in the second direction than the plurality of first input/output pads from the first stack.

18. The semiconductor package of claim 16, wherein
one of the plurality of first input/output wires connects the third input/output pads of a lowermost one of the first semiconductor chips to the first input/output pads of the substrate,
the second semiconductor chips are electrically floated from the first semiconductor chips, and
one of the plurality of first power/ground wires connects the third power/ground pads of the lowermost of the first semiconductor chips to the first power/ground pads of the substrate.

19. The semiconductor package of claim 16, wherein
the third input/output wire is provided in plural,
the plurality of third input/output wires are directly connected to corresponding third input/output pads of the second semiconductor chip and corresponding plurality of second input/output pads of the substrate, and
when viewed in plan, the second power/ground wire is provided between the third input/output wires.

20. The semiconductor package of claim 16, wherein first stack and the second stack have an ascending offset stack structure along the second direction.

* * * * *